United States Patent [19]

Sugiyama et al.

[11] Patent Number: 5,018,110
[45] Date of Patent: May 21, 1991

[54] SERIAL INPUT/OUTPUT SEMICONDUCTOR MEMORY

[75] Inventors: Tsutomu Sugiyama, Kuwana; Akihiko Watanabe, Minokamo, both of Japan

[73] Assignees: Fujitsu Limited, Kawasaki; Fujitsu VLSI Limited, Kasugai, both of Japan

[21] Appl. No.: 407,091

[22] Filed: Sep. 14, 1989

[30] Foreign Application Priority Data

Sep. 20, 1988 [JP] Japan ................................. 63-235695

[51] Int. Cl.[5] .............................................. G11C 7/00
[52] U.S. Cl. ................................ 365/230.09; 365/221; 365/240
[58] Field of Search .................. 365/189.05, 189.12, 365/230.05, 230.04, 230.09, 239, 240, 233, 221

[56] References Cited

U.S. PATENT DOCUMENTS

| | | | |
|---|---|---|---|
| 4,322,635 | 3/1982 | Redwine | 365/240 X |
| 4,412,313 | 10/1983 | Ackland et al. | 365/227 |
| 4,646,272 | 2/1987 | Takasugi | 365/233 |
| 4,688,197 | 8/1987 | Novak et al. | 365/230.03 |
| 4,740,923 | 4/1988 | Kaneko et al. | 365/194 |
| 4,825,411 | 4/1989 | Hamano | 365/230.05 |

Primary Examiner—Joseph A. Popek
Attorney, Agent, or Firm—Armstrong, Nikaido, Marmelstein, Kubovcik & Murray

[57] ABSTRACT

A semiconductor memory includes a random access memory (RAM) and a serial access memory (SAM). The RAM includes a memory cell array including memory cells. The SAM includes a data register including a plurality of bit cells which store bits of data read out from the memory cell array and assigned consecutive numbers, a first data bus line which is connected to odd numbered bit cells of the data register, a second data bus line which is connected to even numbered bit cells of the data register, a switching circuit for outputting serial data from the data register by alternately connecting to one of the first and second data bus lines, a first reset circuit for resetting the first data bus line when active, a second reset circuit for resetting the second data bus line when active, and a control circuit for selectively making the first and second reset circuits active so that a data transfer period of one of the first and second data bus lines starts prior to an end of a data transfer period of the other of the first and second data bus lines.

12 Claims, 4 Drawing Sheets

SERIAL INPUT/OUTPUT SEMICONDUCTOR MEMORY

BACKGROUND OF THE INVENTION

The present invention generally relates to semiconductor memories, and more particularly to a semiconductor memory which can serially input or output data consecutively and is provided with two data bus lines respectively for odd bits and even bits.

Generally, in a semiconductor memory which is used in the field of image processing, there is a demand to enable both a random data access from a central processing unit (CPU) and a serial data access from a cathode ray tube (CRT). Hence, a so-called dual port memory which has a random access port and a serial access port is used in the field of image processing.

A conventional dual port memory comprises a random access memory (RAM) and a serial access memory (SAM) which is provided with a data register for holding data amounting to one word of the RAM. A serial access is made to each cell of the data register by designation of a pointer. The serial data which is obtained by the access is output as dot data. Alternatively, external serial data may be written into the data register.

A display time per pixel on a high resolution CRT is extremely short, and the display time is for example 20.9 ns per dot on a CRT having 1120×750 dots. For this reason, a high access speed is required of the serial access port.

Accordingly, a data bus line which connects each cell of the data register to an input/output buffer is divided into two systems, that is, a data bus line for odd bits and a data bus line for even bits. During an active period (data transfer period) in which the data bus line of one system is made active, the data bus line of the other system is set to a reset period for the following reasons. That is, if the serial transfer is carried out solely by use of the data bus line of one system, the data bus line must be reset after one bit of data is transferred and the data transfer is inevitably stopped during this reset period. But by providing two systems of data bus lines, it is possible to avoid stopping the data transfer and therefore improve the serial access speed.

A description will now be given of the resetting the data bus line. Generally, the data bus line comprises a pair of signal lines and the data transfer is made by detecting a potential difference between the pair of signal lines in a sense amplifier. In order to carry out the data transfer at a high speed, it is necessary to erase the transfer data of the previous cycle, that is, the potential difference of the previous cycle. The potential difference is cleared to zero by short-circuiting the pair of signal lines and the potentials of the pair of signal lines are both pulled up to a high level so as to erase the potential difference of the previous cycle, that is, to reset the pair of signal lines. After the reset operation is made, one of the pair of signal lines is discharged to a low level in the next cycle, and it is possible to quickly increase the potential difference between the pair of signal lines and accordingly sense the potential difference at a high speed.

However, in the conventional dual port memory, the data bus lines of the two systems are respectively set to the active period and the reset period in synchronism with a rising edge in an external serial access strobe (SAS) signal which has a duty factor of 50%. As a result, there is a limit to increasing the serial access speed for the following reasons.

FIGS.1(A) through 1(F) are timing charts for explaining the operation of the conventional dual port memory. FIG.1(A) shows the SAS signal, FIG.1(B) shows a signal on the data bus line for the odd bits, FIG.1(C) shows a signal on the data bus line for the even bits, FIG.1(D) shows multiplexed data (serial data), FIG.1(E) shows odd bit data, and FIG.1(F) shows even bit data. Each active period and each reset period of the data bus lines for the odd and even bits are respectively determined by the rising edge of the SAS signal. Hence, the active period and the reset period have identical lengths which are equal to a cycle time $t_{sc}$ of the SAS signal. But because the cycle time $t_{sc}$ cannot be made shorter than the actual active period, there is a limit to increasing the serial access speed by the reduction of the cycle time $t_{sc}$. On the other hand, when the active period is set long to suit an external device, the cycle time $t_{sc}$ also becomes long.

SUMMARY OF THE INVENTION

Accordingly, it is a general object of the present invention to provide a novel and useful semiconductor memory in which the problems described above are eliminated.

Another and more specific object of the present invention is to provide a semiconductor memory comprising a memory cell array including a plurality of memory cells, a data register connected to the memory cell array and including a plurality of bit cells which store a plurality of bits of data read out from the memory cell array, where the bit cells are assigned consecutive numbers, a first data bus line which is connected to odd numbered bit cells of the data register, a second data bus line which is connected to even numbered bit cells of the data register, switching means for outputting serial data from the data register by alternately connecting to one of the first and second data bus lines, a first reset circuit for resetting the first data bus line when active, a second reset circuit for resetting the second data bus line when active, and control device for selectively making the first and second reset circuits active so that a data transfer period of one of the first and second data bus lines starts prior to an end of a data transfer period of the other of the first and second data bus lines. According to the semiconductor memory of the present invention, it is possible to set the active and reset periods of the first and second data bus lines to suit the required operation. Therefore, it is possible to shorten the cycle time of an external serial access strobe signal close to the limit and satisfactorily increase the serial access speed.

Other objects and further features of the present invention will be apparent from the following detailed description when read in conjunction with the accompanying drawings.

DESCRIPTION OF THE PREFERRED EMBODIMENTS

A description will be given of an embodiment of a semiconductor memory according to the present invention, by referring to FIGS.2, 3 and 4(A) through 4(H). In this embodiment, the present invention is applied to a dual port memory.

Figure 1:
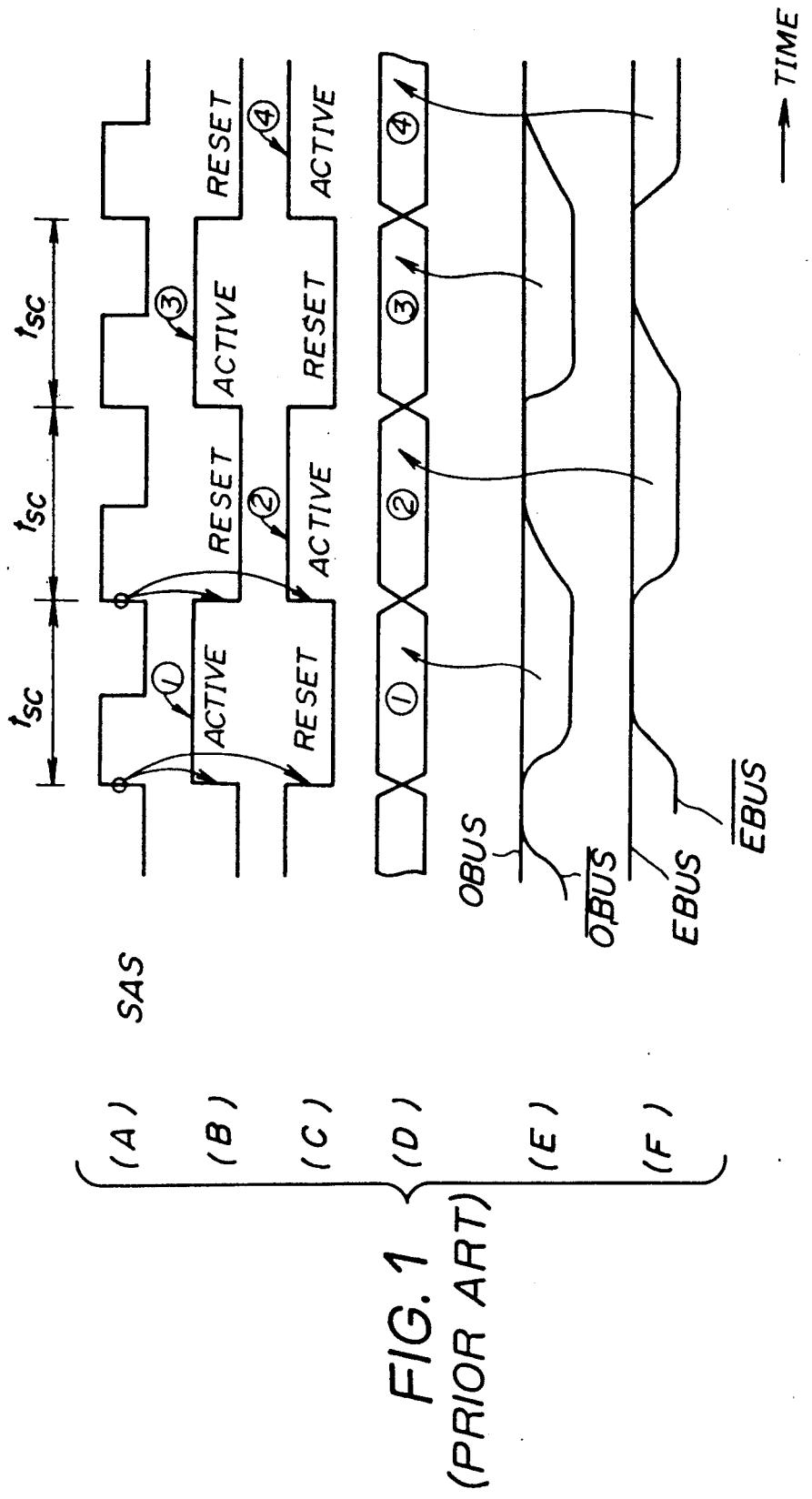
FIGS.1(A) through 1(F) are timing charts for explaining an operation of a conventional dual port memory.
Figure 2:
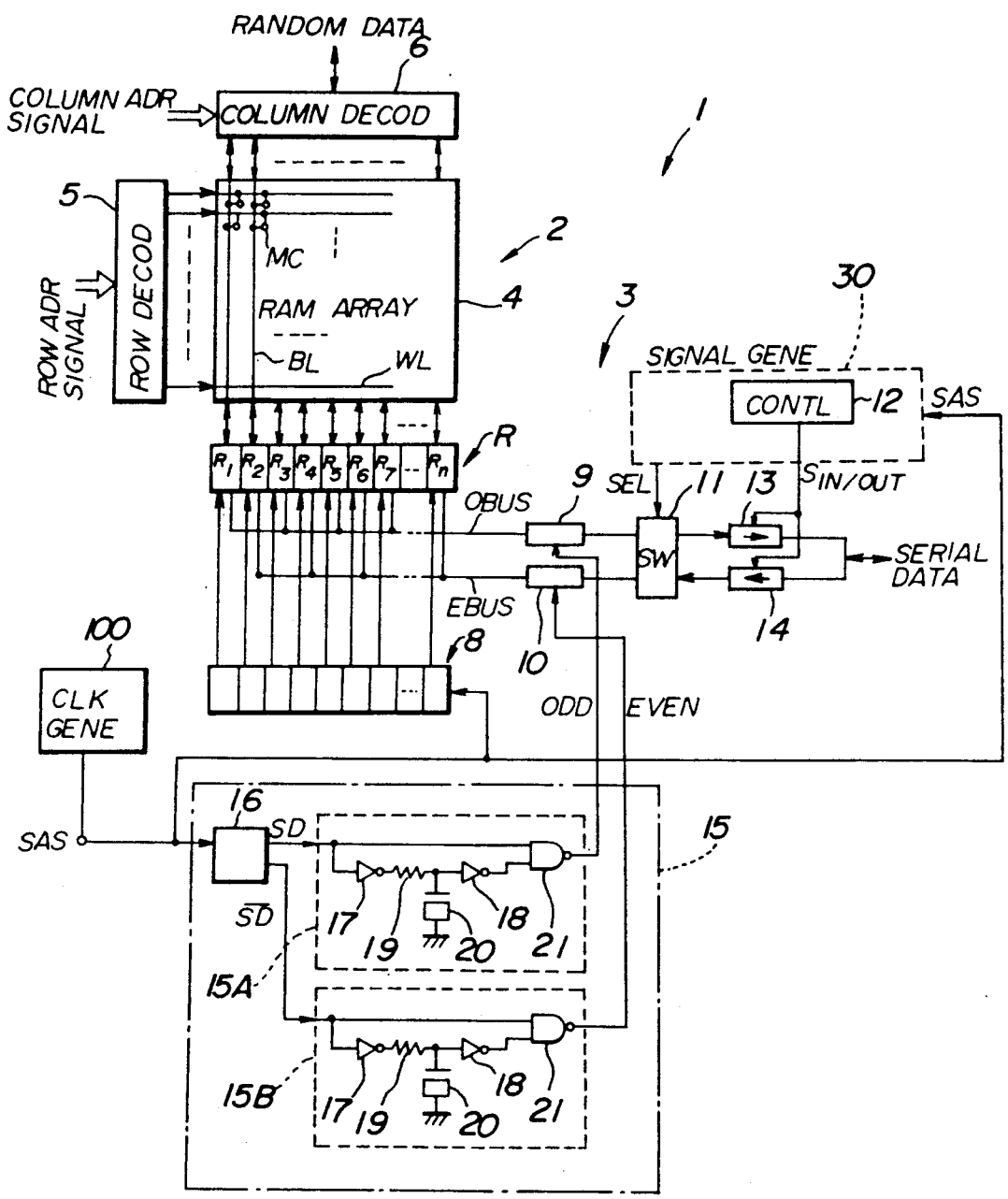
FIG.2 is a system block diagram generally showing an embodiment of a semiconductor memory according to the present invention.

FIG.2 generally shows the embodiment, and a dual port memory 1 comprises a random access memory (RAM) 2 and a serial access memory (SAM) 3.

The RAM 2 comprises a RAM array 4 in which a plurality of memory cells MC are arranged in an array and each memory cell MC is connected to one of a plurality of word lines WL and one of a plurality of bit lines BL, a row decoder 5 for selecting a word line WL by decoding a row address signal, and a column decoder 6 for selecting a bit line BL by decoding a column address signal. The column decoder 6 includes a sense amplifier and an input/output gate for writing random data to and reading random data from a memory cell MC which is connected to the selected bit line BL and the selected word line WL.

On the other hand, the SAM 3 comprises a data register R which is made up of bit cells R1 through Rn corresponding to one word of the RAM array 4, a pointer 8 for successively selecting the bit cells R1 through Rn for each period of a serial access strobe (SAS) signal, a data bus line OBUS for odd bits which is connected to the odd numbered bit cells R1, R3, R5, . . . , a data bus line EBUS for even bits which is connected to the even numbered bit cells R2, R4, R6, . . . , an odd side sense amplifier/write amplifier (first reset circuit) 9, an even side sense amplifier/write amplifier (second reset circuit) 10, a switching circuit 11, an output buffer 13, an input buffer 14, and a bus control circuit 15.

As will be described later, the odd side sense amplifier/write amplifier 9 writes data to or reads data from a selected bit cell of the data register R through the data bus line OBUS during an active period of an odd bus control signal ODD and resets the data bus line OBUS to a predetermined potential during a reset period of the odd bus control signal ODD. The even side sense amplifier/write amplifier 10 writes data to or reads data from a selected bit cell of the data register R through the data bus line EBUS during an active period of an even bus control signal EVEN and resets the data bus line EBUS to a predetermined potential during a reset period of the even bus control signal EVEN. The switching circuit 11 alternately switches the active data bus lines OBUS and EBUS based on a switching control signal SEL which is synchronized to the SAS signal. One of the output buffer 13 and the input buffer 14 is operated responsive to an input/output control signal $S_{IN/OUT}$ which is received from an input/output control circuit 12.

The SAS signal is generated from an external clock generator 100. A signal generator 30 generates the switching control signal SEL and the input/output control signal $S_{IN/OUT}$ based on the SAS signal. The input/output control circuit 12 which generates the input/output control signal $S_{IN/OUT}$ is a part of this signal generator 30.

The bus control circuit 15 comprises a frequency dividing circuit 16 and circuits 15A and 15B which have identical circuit constructions. The frequency dividing circuit 16 frequency-divides the SAS signal by ½ and outputs a signal SD and an inverted signal $\overline{SD}$ thereof. Because the circuit constructions of the circuits 15A and 15B are the same, only the circuit 15A will be described for the sake of convenience. The circuit 15A comprises inverters 17 and 18, a resistor 19, a metal oxide semiconductor (MOS) capacitor 20, and a NAND gate 21 which are connected as shown. The circuit 15A generates as a first clock signal the odd bus control signal ODD which has an active period which starts from a rising edge of the signal SD (that is, the rising edge of the SAS signal) and lasts for a delay time $T_A$ which is determined by a time constant $\tau$ of the resistor 19 and the MOS capacitor 20 and a reset period which starts from an end of the active period and lasts until the next rising edge of the signal SD. Similarly, the circuit 15B generates as a second clock signal the even bus control signal EVEN which has an active period which starts from a rising edge of the signal $\overline{SD}$ (that is, the falling edge of the SAS signal) and lasts for a delay time $T_B$ which is determined by a time constant $\tau$ of the resistor 19 and the MOS capacitor 20 and a reset period which starts from an end of the active period and lasts until the next rising edge of the signal $\overline{SD}$.

Figure 3:
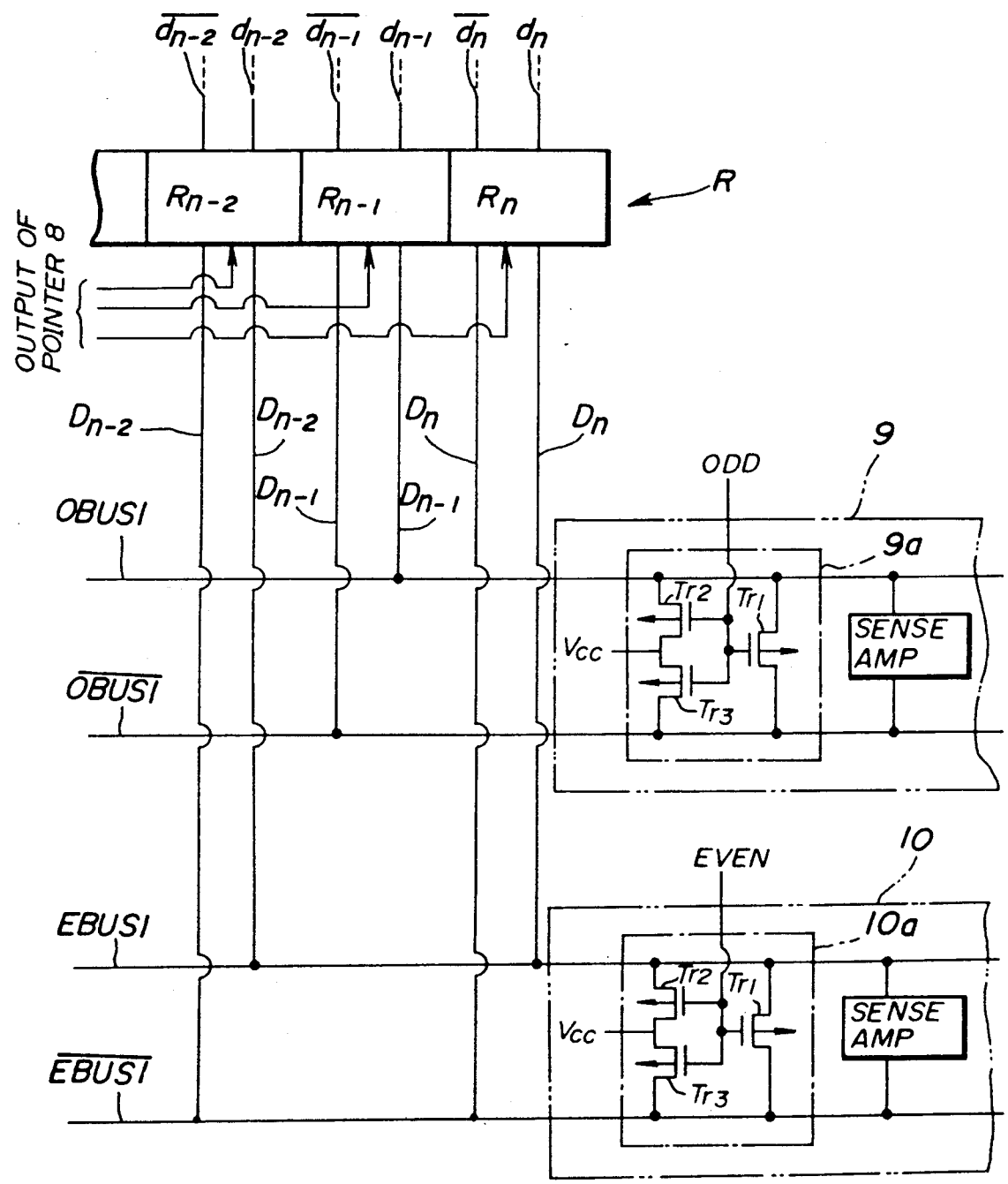
FIG.3 is a system block diagram showing an essential part of the semiconductor memory shown in FIG.2.

FIG.3 shows an essential part of the embodiment shown in FIG.2 including the data bus lines OBUS and EBUS. The data bus line OBUS comprises a pair of data bus lines OBUS1 and $\overline{OBUS1}$ for odd bits, and the data bus line EBUS comprises a pair of data bus lines EBUS1 and $\overline{EBUS1}$ for even bits. The bus line pair for the odd bits is connected to an odd side reset circuit 9a which constitutes a part of the odd side sense amplifier/write amplifier 9. The bus line pair for the even bits is connected to an even side reset circuit 10a which constitutes a part of the even side sense amplifier/write amplifier 10. The reset circuits 9a and 10a have the same circuit construction, and only the reset circuit 9a will be described for the sake of convenience. The reset circuit 9a comprises a transistor Tr1 which short-circuits the data bus lines OBUS1 and $\overline{OBUS1}$ when the odd bus control signal ODD has a high level, and transistors Tr2 and Tr2 which simultaneously pull up the data bus lines OBUS1 and $\overline{OBUS1}$ to a power source voltage Vcc which corresponds to the high level.

Figure 4:
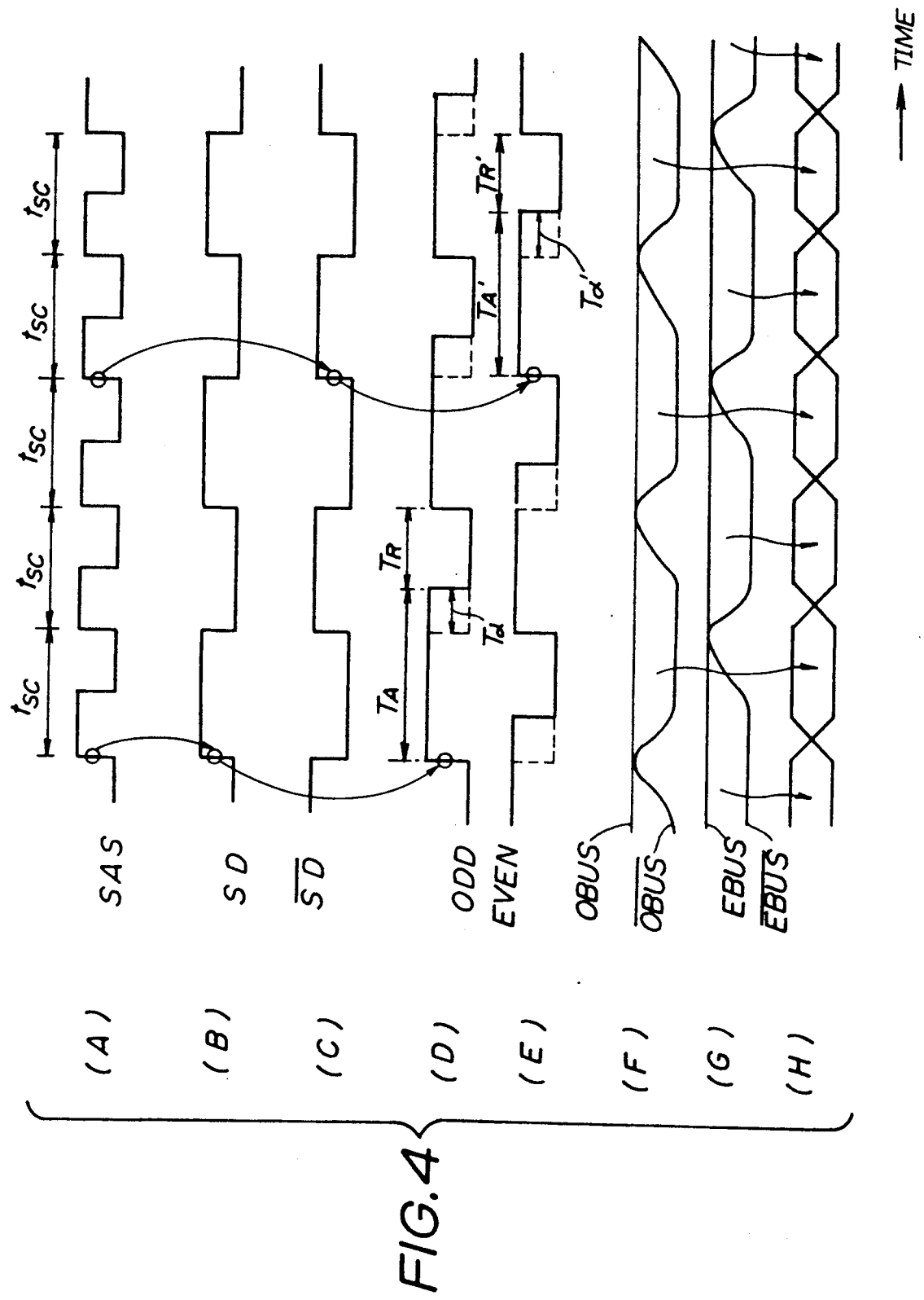
FIGS.4(A) through 4(H) are timing charts for explaining an operation of the embodiment.

Next, a description will be given of the operation of the embodiment by referring to the timing charts of FIGS.4(A) through 4(H). FIG.4(A) shows the SAS signal, FIG.4(B) shows the signal SD, FIG.4(C) shows the inverted signal $\overline{SD}$, FIG.4(D) shows the odd bus control signal ODD, FIG.4(E) shows the even bus control signal EVEN, FIG.4(F) shows the odd bit data, FIG.4(G) shows the even bit data, and FIG.4(H) shows the serial data.

The signals SD and $\overline{SD}$ shown in FIGS.4(B) and 4(C) are generated by frequency-dividing the SAS signal shown in FIG.4(A) by ½ in the frequency dividing circuit 16. In other words, two cycles of the SAS signal corresponds to one cycle of the signals SD and $\overline{SD}$, and the rising edge of the signals SD and $\overline{SD}$ is synchronized to the rising edge of the SAS signal.

The signal SD applied to the circuit 15A is delayed by the delay time $T_A$ which is determined by the time constant $\tau$ of the resistor 19 and the MOS capacitor 20. The delayed signal SD is applied to the NAND gate 21 wherein a NAND operation is carried out with the undelayed signal SD. As a result, the odd bus control signal ODD shown in FIG.4(D) which is output from the NAND gate 21 includes a high-level period (active period) which lasts for the time $T_A$ from the rising edge of the signal SD (that is, the rising edge of the SAS signal) and a low-level period (reset period) which lasts for a time $T_R$ until the next rising edge of the signal SD. A sum of the times $T_A$ and $T_R$ corresponds to two cycles of the SAS signal.

The time $T_A$ is adjustable within a predetermined range $T_\alpha$ by appropriately adjusting the resistance of the resistor 19 and the capacitance of the MOS capacitor 20. Hence, the time $T_A$ can easily be matched to the actual active period of the data bus line OBUS. In a case where the reset time $T_R$ is matched to the actual reset period of the data bus line OBUS, the length of two cycles of the SAS signal coincides with the sum total of the actual active period and reset period of the data bus line OBUS. Accordingly, it is possible to shorten the cycle length $t_{sc}$ of the SAS signal close to the limit and satisfactorily increase the serial access speed.

When the inverted signal $\overline{SD}$ is input to the circuit 15B, the circuit 15B outputs the even bus control signal EVEN shown in FIG.4(E). Similarly as in the case of the odd bus control signal ODD, the active time $T_A$ of the even bus control signal EVEN is also adjustable.

According to this embodiment, the active periods of the odd and even bus control signals ODD and EVEN can be freely set by adjusting the resistance of the resistor 19 and the capacitance of the MOS capacitor 20 within each of the circuits 15A and 15B. In other words, by matching the time $T_A$ to the actual active period and the time $T_R$ to the actual reset period, it becomes possible to shorten the cycle time $t_{sc}$ of the SAS signal close to the limit and satisfactorily increase the serial access speed.

Further, the present invention is not limited to these embodiments, but various variations and modifications may be made without departing from the scope of the present invention.

What is claimed is:

1. A semiconductor memory comprising:
   a memory cell array including a plurality of memory cells;
   a data register, connected to said memory cell array, including a plurality of bit cells which store a plurality of bits of data read out from said memory cell array, said bit cells being assigned consecutive numbers;
   a first data bus line which is connected to a selected one of odd numbered bit cells of said data register;
   a second data bus line which is connected to a selected one of even numbered bit cells of said data register;
   switching means for outputting serial data from said data register by alternately connecting said first and second data bus lines to an output bus line;
   a first reset switch circuit for resetting said first data bus line when active;
   a second reset circuit for resetting said second data bus line when active; and
   control means for selectively making said first and second reset circuits active so that a data transfer period of one of said first and second data bus lines starts prior to an end of a data transfer period of the other of said first and second data bus lines.

2. The semiconductor memory as claimed in claim 1 wherein said control means includes means for generating first and second clock signals based on an external serial access strobe signal which has a duty factor of approximately 50%, said first clock signal having a rising edge which is delayed by a first predetermined time from one of rising and falling edges of the external serial access strobe signal and being supplied to said first reset circuit, said second clock signal having a rising edge which is delayed a second predetermined time from said one of rising and falling edges of an inverted signal of the external serial access strobe signal.

3. The semiconductor memory as claimed in claim 2 wherein said control means includes means for determining said first and second predetermined times.

4. The semiconductor memory as claimed in claim 1 which further comprises signal generating means for generating a switching control signal based on an external serial access strobe signal which has a duty factor of approximately 50%.

5. The semiconductor memory as claimed in claim 4 which further comprises an output buffer which is coupled to said switching means for outputting serial data, said output buffer being activated in response to an input/output control signal which is generated by said signal generating means based on the external serial access strobe signal.

6. The semiconductor memory as claimed in claim 1 wherein said switching means also inputs serial data to said data register by alternately connecting to one of said first and second data bus lines, said data register storing the data to be stored in said memory cell array.

7. The semiconductor memory as claimed in claim 6 which further comprises an input buffer which is coupled to said switching means for receiving the serial data, said input buffer being activated in response to an input/output control signal which is generated by said signal generating means based on the external serial access strobe signal.

8. The semiconductor memory as claimed in claim 1 which further comprises a pointer for successively selecting the bits cells of said data register for each period of an external serial access strobe signal which has a duty factor of approximately 50%.

9. The semiconductor memory as claimed in claim 1 wherein said memory cells are arranged in an array and each memory cell is connected to one of a plurality of word lines and to one of a plurality of bit lines, and said semiconductor memory further comprises a row decoder for selecting one of the word lines responsive to a row address signal and a column decoder for selecting one of the bit lines responsive to a column address signal, said memory cell array, said row decoder and said column decoder constituting a random access memory, said column decoder receiving and outputting random data.

10. The semiconductor memory as claimed in claim 1 wherein said data register, said first and second data bus lines, said switching means, first and second reset circuits and said control means constitute a serial access memory.

11. The semiconductor memory as claimed in claim 1 wherein each of said first and second data bus lines comprise a signal line pair.

12. The semiconductor memory as claimed in claim 11 wherein each of said first and second reset circuits comprise a transistor which short-circuits the signal line pair when a corresponding one of the first and second clock signals has a high level and transistors which simultaneously pull up the signal line pair to a power source voltage which corresponds to the high level.

* * * * *